(12) United States Patent
Zhai et al.

(10) Patent No.: US 10,729,035 B2
(45) Date of Patent: *Jul. 28, 2020

(54) STORAGE DEVICE AND METHOD FOR CONTROLLING ROTATION SPEED OF FAN OF STORAGE DEVICE

(71) Applicant: Dell Products L.P., Round Rock, TX (US)

(72) Inventors: Haifang Zhai, Shanghai (CN); Hendry Xiaoping Wu, Shanghai (CN); Yujie Zhou, Shanghai (CN); David Dong, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/743,032

(22) Filed: Jan. 15, 2020

(65) Prior Publication Data

US 2020/0154601 A1    May 14, 2020

Related U.S. Application Data

(63) Continuation of application No. 16/248,378, filed on Jan. 15, 2019, now Pat. No. 10,575,435.

(30) Foreign Application Priority Data

Jan. 18, 2018    (CN) .......................... 2018 1 0049824

(51) Int. Cl.
*H05K 7/20*    (2006.01)
*G11B 33/14*   (2006.01)
*G06F 1/20*    (2006.01)

(52) U.S. Cl.
CPC ......... *H05K 7/20209* (2013.01); *G06F 1/206* (2013.01); *G11B 33/142* (2013.01); *H05K 7/20172* (2013.01)

(58) Field of Classification Search
CPC ......... G06F 1/206; G06F 1/20; G11B 33/142; G11B 33/1413; G11B 33/144; G11B 33/1446; H05K 7/20209; H05K 7/20172
See application file for complete search history.

(56) References Cited

U.S. PATENT DOCUMENTS 7,414,805 B1    8/2008  Ochs et al.
7,864,530 B1    1/2011  Hamburgen et al.
(Continued)

*Primary Examiner* — Brian E Miller
(74) *Attorney, Agent, or Firm* — Ryan, Mason & Lewis, LLP

(57) ABSTRACT

The present disclosure relates to a storage device and a method of controlling a rotation speed of a fan of the storage device. The storage device comprises: a housing comprising an opening; a fan arranged at an end of the housing opposed to the opening; a tray comprising a plurality of partitions arranged in rows and being operable to be drawn out of or inserted into the housing via the opening in a longitudinal direction of the housing; a plurality of tray position detectors respectively arranged on the plurality of partitions and configured to detect a relative position of the tray with respect to the housing; and a controller adapted to adjust a rotation speed of the fan according to the relative position detected by the tray position detector. The storage device according to the present disclosure can effectively reduce the negative pressure formed in the housing, avoid or reduce the recesses of the housing, and enable the tray to be smoothly inserted into the housing, thereby avoiding damage to the disks therein.

20 Claims, 7 Drawing Sheets

(56) References Cited

U.S. PATENT DOCUMENTS

| | | |
|---|---|---|
| 9,760,098 B1 | 9/2017 | Imwalle et al. |
| 2003/0234624 A1* | 12/2003 | Frankel .................... H02P 6/08 |
| | | 318/268 |
| 2005/0018399 A1 | 1/2005 | Shimizu |
| 2007/0281639 A1 | 12/2007 | Clidaras et al. |
| 2009/0195629 A1 | 8/2009 | Yamada et al. |
| 2009/0249862 A1 | 10/2009 | Glover et al. |
| 2011/0054705 A1 | 3/2011 | Vaidyanathan et al. |
| 2012/0074121 A1 | 3/2012 | Gagas et al. |
| 2013/0248140 A1 | 9/2013 | Haigh |
| 2014/0014292 A1 | 1/2014 | Rice et al. |
| 2016/0363901 A1 | 12/2016 | Arakawa |
| 2017/0156238 A1* | 6/2017 | Li ...................... H05K 7/20209 |
| 2017/0242463 A1 | 8/2017 | Matteson et al. |
| 2019/0223321 A1 | 7/2019 | Zhai et al. |
| 2019/0235592 A1* | 8/2019 | Huang .................... G06F 1/206 |
| 2019/0361508 A1* | 11/2019 | Yarragunta ........... F04D 25/166 |

* cited by examiner

STORAGE DEVICE AND METHOD FOR CONTROLLING ROTATION SPEED OF FAN OF STORAGE DEVICE

RELATED APPLICATION(S)

The present application is a continuation of U.S. patent application Ser. No. 16/248,378, filed Jan. 15, 2019 and entitled "Storage Device and Method for Controlling Rotation Speed of Fan of Storage Device," which claims priority to Chinese Patent Application No. 201810049824.6, filed Jan. 18, 2018 and entitled "Storage Device and Method for Controlling Rotation Speed of Fan of Storage Device," which are both incorporated by reference herein in their entirety.

FIELD

Embodiments of the present disclosure generally relate to storage devices, and more specifically, to a storage device capable of controlling a rotation speed of a fan.

BACKGROUND

During design and use of a storage device, particularly a storage device having a housing and a tray arranged in the housing, the tray is provided with a plurality of disks (e.g., comprising but not limited to a magnetic disk, an optical disk, a hard disk, a U disk and so on). Since the disks and a control device therein generate a lot of heat during rotation, one or more fans are usually disposed at an end of the housing, to dissipate heat.

Fans usually enable air to flow out of the housing to discharge hot air within the housing out of the housing to dissipate heat. This inevitably forms a negative pressure within the housing. The higher the rotation speed of the fan is, the larger the formed negative pressure is. When the disks or control device in the tray need to be maintained or repaired, usually portions of the tray except the innermost end all need to be drawn out of the housing. Since the housing is usually made of a thin metal plate, in the above case if the fan still rotates at a higher rotation speed, the negative pressure formed by the fan in the housing causes walls of the housing to recess. As a result, the tray and the disks thereon cannot be inserted into the housing upon completion of the maintenance or repair, or the disks or control device therein might be damaged upon insertion.

SUMMARY

Embodiments of the present disclosure provide a solution for providing a storage device and a method for controlling a rotation speed of a fan.

In a first aspect, a storage device is provided. The storage device comprises a housing comprising an opening; a fan arranged at an end of the housing opposed to the opening; a tray comprising a plurality of partitions arranged in rows and being operable to be drawn out of or inserted into the housing via the opening in a longitudinal direction of the housing; a plurality of tray position detectors respectively arranged on the plurality of partitions and configured to detect a relative position of the tray with respect to the housing; and a controller adapted to adjust a rotation speed of the fan according to the relative position detected by the tray position detector.

In some embodiments, each of the plurality of partitions has a first side and a second side which are opposed to each other, the first side is adapted to couple to a plurality of disks, and a corresponding tray position detector is arranged on the second side.

In some embodiments, the tray position detector comprises a photoelectric detector which is configured to determine the relative position of the tray with respect to the housing by detecting changes of light caused when the corresponding partition is inserted into or drawn out of the housing.

In some embodiments, the controller is configured to, in response to the corresponding tray position detector detecting that one of the plurality of partitions adjacent to the end enters the housing, control the fan to rotate at a rotation speed lower than a predetermined threshold.

In some embodiments, the controller is configured to, in response to the tray position detector detecting that the plurality of partitions are all located in the housing, control the fan to rotate within a predetermined rotation speed range.

In some embodiments, the controller is configured to, in response to at least one of the plurality of tray position detectors detecting that at least one corresponding partition is drawn out of the housing, control the fan to rotate at a rotation speed higher than a predetermined threshold.

In some embodiments, the controller is configured to, in response to the fan rotating at a rotation speed lower than the predetermined threshold for a predetermined period of time, increase the rotation speed of the fan.

In a second aspect, a method of controlling a rotation speed of a fan of a storage device is provided. The method comprises receiving a relative position of a tray with respect to a housing from a plurality of tray position detectors respectively disposed on a plurality of partitions of the tray of the storage device, wherein the plurality of partitions are arranged in the tray in rows, and the tray is operable to be drawn out of or inserted into the housing via an opening of the housing in a longitudinal direction of the housing of the storage device; adjusting a rotation speed of the fan arranged at an end of the housing opposed to the opening, according to the relative position of the tray with respect to the housing as detected by the tray position detector.

In some embodiments, the method further comprises, in response to detecting that one of the plurality of partitions adjacent to the end enters the housing, controlling the fan to rotate at a rotation speed lower than a predetermined threshold.

In some embodiments, the method further comprises, in response to detecting that the plurality of partitions are all located in the housing, controlling the fan to rotate within a predetermined rotation speed range.

In some embodiments, the method further comprises, in response to detecting that at least one of the partitions is drawn out of the housing, controlling the fan to rotate at a rotation speed higher than a predetermined threshold.

In some embodiments, the method further comprises, in response to the fan rotating at a rotation speed lower than the predetermined threshold for a predetermined period of time, controlling the fan to increase the rotation speed.

In a third aspect, a program product adapted to be executed by a controller of the storage device to perform the above-mentioned method is provided.

Further features of the present disclosure will be made apparent through the following description of exemplary embodiments with reference to the figures.

It is to be understood that the Summary of the Invention is not intended to identify key or important features of embodiments of the present disclosure, nor is it intended to limit the scope of the present disclosure. Other features of the present disclosure will be made apparent through the following depictions.

BRIEF DESCRIPTION OF THE DRAWINGS

Through the following detailed description with reference to the accompanying drawings, the above and other objectives, features and advantages of example embodiments disclosed herein will become more comprehensible. In the drawings, several example embodiments disclosed herein will be illustrated in an example and non-limiting manner, wherein.

DETAILED DESCRIPTION

Figure 1:
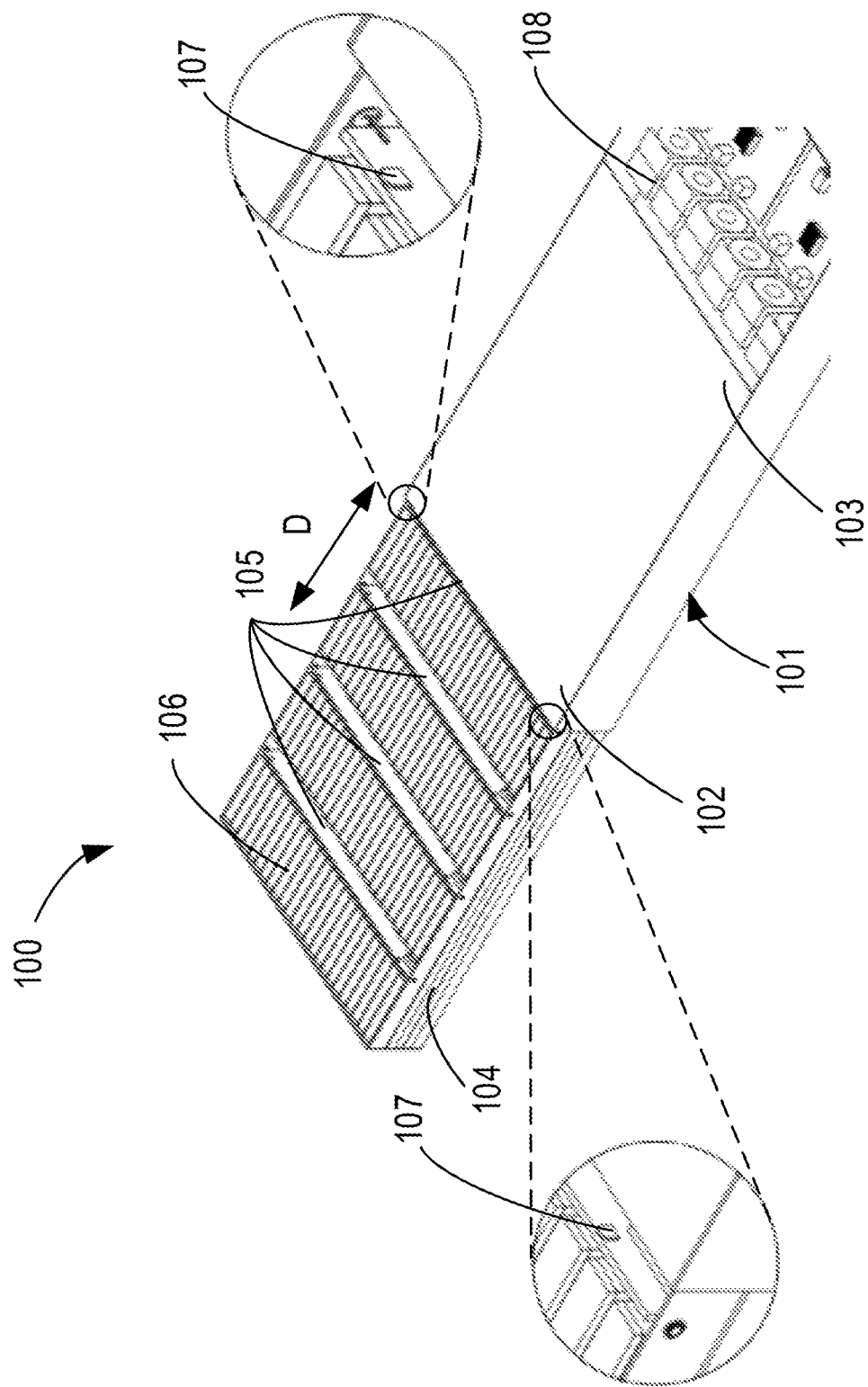
FIG. 1 illustrates a perspective view of a storage device according to embodiments of the present disclosure, wherein a tray is drawn out of the housing.

Principles of the present disclosure will now be described with reference to various example embodiments illustrated in the drawings. It is to be understood that the depiction of these embodiments is only to enable those skilled in the art to better understand and further implement the present invention, not intended for limiting the scope of the present invention in any manner. It is noted that wherever practicable similar or like reference numbers may be used in the figures, and may indicate similar or like functionality. One skilled in the art will readily recognize from the following description that alternative embodiments of the structures and methods illustrated herein may be employed without departing from the principles of the present disclosure described therein.

As used herein, the term "comprises" and its variants are to be read as open terms that mean "comprises, but is not limited to." The term "based on" is to be read as "based at least in part on." The term "one implementation" and "an implementation" are to be read as "at least one implementation." The term "another implementation" is to be read as "at least one other implementation."

During use of a storage device, particularly during use of a storage device having a housing and a tray arranged in the housing, when the tray is drawn out of the housing to maintain or repair the disks therein, the fans are usually caused to rotate at a maximum rotation speed. Since the housing is usually made of a thin metal plate, in the above case if the fan still rotates at a higher rotation speed, the negative pressure formed by the fan in the housing causes walls of the housing to recess. As a result, the tray and the disks thereon cannot be inserted into the housing upon completion of the maintenance or repair, or the disks or control device therein might be damaged upon insertion.

Embodiments of the present disclosure provide a storage device and a method of controlling a rotation speed of a fan of the storage device, to at least partially address the above and other potential problems of the conventional scheme.

The structure of the storage device according to example embodiments of the present disclosure will be described below in detail with reference to FIG. 1 through FIG. 6. FIG. 1 illustrates a perspective view of a storage device according to embodiments of the present disclosure, wherein a tray is drawn out of the housing.

Figure 2:
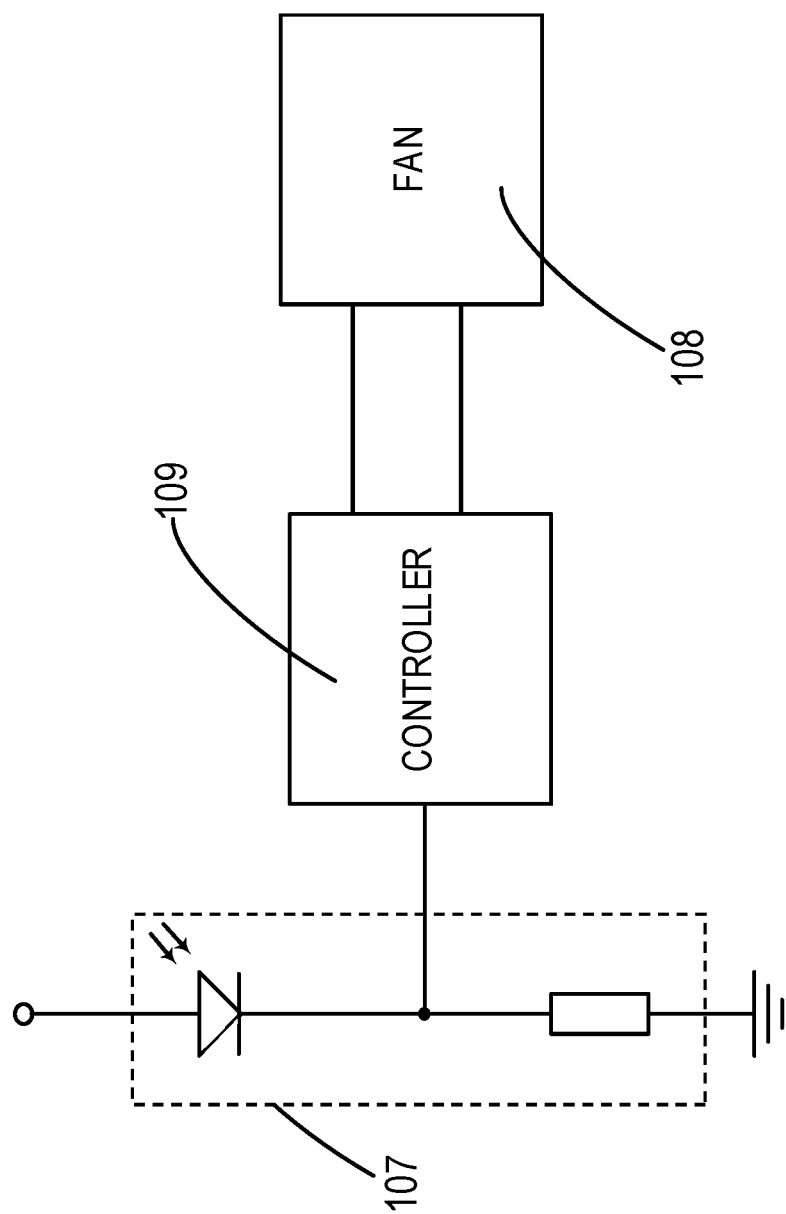
FIG. 2 illustrates a schematic diagram of a control circuit in the storage device according to an example embodiment of the present disclosure.

As shown in FIG. 1, generally the storage device described here comprises a housing 101, a fan 108, a tray 104 and a controller 109 (see also FIG. 2). The housing 101 generally has a framework structure and has two ends opposed in a longitudinal direction D. At one end is disposed an opening 102 through which the tray 104 is inserted into or drawn out of the housing 101 in the longitudinal direction D. The tray 104 comprises a plurality of partitions 105 arranged in rows, to respectively couple the plurality of disks 106. The fan 108 is arranged at the end of the housing opposed to the opening 102. Upon rotating, the fan 108 may dissipate heat generated by the disks 106 and the controller 109 in the housing 101 out of the housing 101.

Contrary to a conventional storage device, the storage device 100 according to embodiments of the present disclosure further comprises a plurality of tray position detectors 107. The tray position detectors 107 are respectively arranged on corresponding partitions 105, and can detect a relative position of the tray 104 with respect to the housing 101. The controller 109 can adjust the rotation speed of the fan 108 according to the detected relative position of the tray 104 with respect to the housing 101.

By using the tray position detector 107 to detect the relative position of the tray 104 with respect to the housing 101 and control the rotation speed of the fan 108 according to the relative position, the storage device 100 according to embodiments of the present disclosure can control the fan 108 to rotate at a low speed when the tray 104 is completely drawn out of the housing 101 and to be inserted in the housing 101. This can effectively reduce the negative pressure in the housing 101 caused by the fan 108, avoid or reduce the recesses of the housing 101, i.e., enable the tray 104 to be smoothly inserted into the housing 101, thereby avoiding damage to the disks 106 therein.

In some embodiments, as shown in enlarged views in FIG. 1, the tray position detector 107 may use a photoelectric detector, to detect the relative position of the tray 104 with respect to the housing 101 by detecting changes of light caused when the corresponding partitions 105 are inserted into or drawn out of the housing 101. For example, upon completion of repair or maintenance, the tray 104 needs to be inserted into the housing 101. A partition located at the innermost side, namely, the partition nearest to the end 103 where the fan 108 is disposed, first enters the housing 101 from outside of the housing 101.

At this time, the tray position detector 107 disposed on the partition 105 detects that the partition 105 is already inserted into the housing 101 according to the change of the light thereon from brightness to dimness. As shown in FIG. 2, the controller 109 is coupled to the tray position detector 107 in a certain manner, so that a detection result from the tray position detector 107 will be transmitted to the controller 109. The controller 109 judges that the tray 104 will be inserted into the housing 101 according to the detection result, and thereby controls the fan 108 to rotate at a speed lower than a predetermined threshold.

This effectively avoids recesses of the housing 101 caused by the negative pressure when the fan 108 rotates at a high speed so that the tray 104 can be inserted smoothly into the housing 101. It can be seen that by means of the photoelectric detector of low cost, problems that the tray 104 is difficult to be inserted in to the housing 101 or components therein are damaged when the tray 104 is inserted into the housing 101 are solved without performing structural adjustment to a conventional storage device. Therefore, this also avoids economic loss caused by the above problems.

It is to be understood that the above embodiment in which the tray position detector 107 employs a photoelectric detector is only for illustration, and not intended to limit the scope of the present application. Any other proper sensors, structures and/or arrangements are also possible. For example, the tray position detector 107 may also use any other proper sensor such as a gyro, a magnetic element or a relative position sensor to implement the above solution.

In some embodiments, as shown in FIG. 1, the tray position detector 107 and the disk 106 may be disposed on both sides of the partition 105 respectively. The tray position detector 107 may be located in an upper portion of the partition 105 to facilitate detection. In some embodiments, the partition 105 may be a circuit board, which is coupled to a circuit board, which the controller 109 and/or fan 108 is disposed on, in a plugged manner to transmit signals. In some embodiments, the controller 109 according to embodiments of the present disclosure may be a controller controlling the disk 106 of the storage device to operate, or may also use a separate controller 109. In some embodiments, the tray position detector 107 is coupled to the controller 109 in a wired or wireless manner.

In some embodiments, the tray position detector 107 may also detect a plurality of brightness levels comprising bright and dark. The controller 109 may respectively implement different functions according to the detected plurality of brightness levels. For example, the tray position detector 107 may detect that the light is darkened, but is not dark enough to indicate that the tray 104 has been already inserted into the housing 101. The controller 109 may, according to the detection result, judge that the tray 104 is not yet inserted into the housing 101 but shielded by other objects, and thereby control the fan 108 to rotate at a rotation speed lower than or higher than a predetermined threshold according to the judgment.

The predetermined threshold of the rotation speed of the fan 108 may be set or adjusted by the user. The predetermined threshold may be set as a rotation speed that does not cause the housing 101 to recess or only causes small recesses that do not affect smooth insertion of the tray 104 into the housing 101. For example, the predetermined threshold may be set as different values depending on different materials of the housing 101. For example, in the case that the housing 101 is relatively thick and is not apt to recess, the predetermined threshold may be set to a larger value. In the case that the housing 101 is thinner, the predetermined threshold may be set to a smaller value.

To avoid influence on heat dissipation, in some embodiments, after the innermost partition 105 in the tray 104 is inserted into the housing 101 and the fan 108 rotates at a rotation speed lower than the predetermined threshold for a predetermined period of time, the fan 108 may be enabled to rotate at a rotation speed higher than the predetermined threshold or at a full speed. The predetermined period of time may be generally a period of time, for example, three seconds from the time when the tray 104 is completely drawn out of the housing 101 to time when the tray 104 is completely inserted into the housing 101. In some embodiments, the user may adjust the predetermined period of time as needed.

In some embodiments, while controlling the fan 108 to rotate at a rotation speed higher than the predetermined threshold or at a full speed, the controller 109 may then judge whether the tray has already been completely inserted into the housing 101 according to a position of a partition adjacent to the innermost partition 105 (namely, the third partition counted from outside to inside as shown in FIG. 1). For example, if the tray position detector 107 on the third partition 105 detects that the partition 105 is already located in the housing 101 after the predetermined period of time, the controller judges that the tray 104 has already been completely inserted in the housing 101. In some embodiments, the controller 109 may also further judge that the tray 104 has already been completely inserted into the housing 101 after the tray position detector 107 on the outermost partition 105 detects that the outermost partition 105 has already entered the housing 101, and control the fan 108 to rotate at a rotation speed higher than the predetermined threshold or at a full speed for the predetermined period of time.

If the tray position detector 107 on the third partition 105 detects that the partition 105 is still located out of the housing 101 after the predetermined period of time, it is possible to judge whether all partitions 105 are drawn out of the housing 101 according to the state of the tray position detector 107 on the innermost partition 105. If the controller 109 judges that the innermost partition 105 is located outside the housing 101 again at this time, which is caused by the tray 104 being drawn out again for maintenance or repair after being inserted back into the housing 101. At this time, detection is continued to check whether the innermost partition 105 is inserted into the housing 101 again. If it is inserted into the housing 101 again, the controller 109 enables the fan 108 to rotate at a rotation speed lower than the predetermined threshold as mentioned above, and then performs subsequent detection and control as mentioned above.

In some embodiments, after the tray 104 is just inserted into the housing 101, the controller 109 may control the fan to rotate at a rotation speed higher than the predetermined threshold or at a full speed. Such control may enable the fan 108 to quickly discharge heat generated during the repair and during rotation at a rotation speed lower than the threshold out of the housing 101, to avoid damage to the disks therein due to heat.

Figure 3:
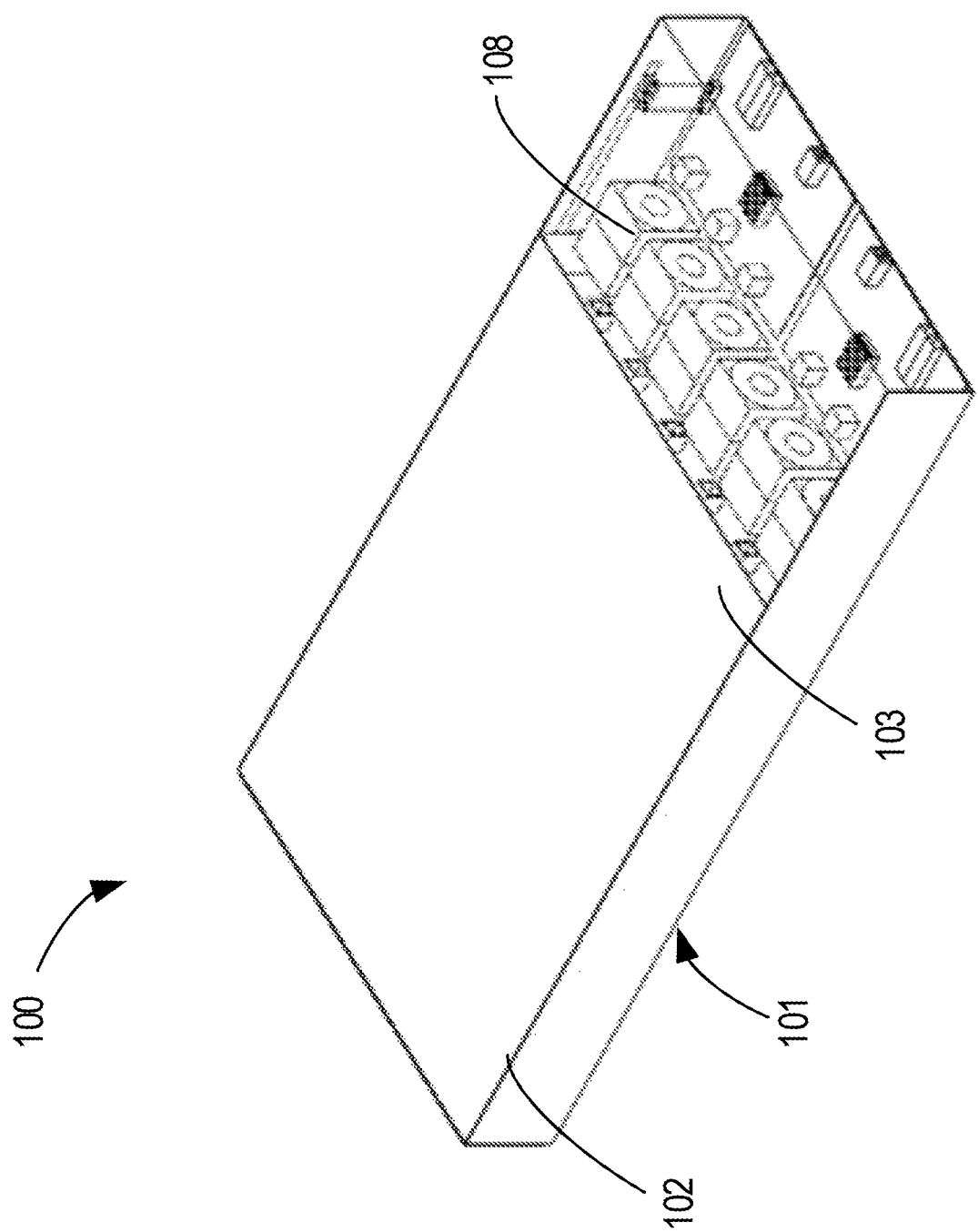
FIG. 3 illustrates a perspective view of a storage device according to embodiments of the present disclosure.

After the tray 104 has already been completely inserted into the housing 101 and the fan rotates at a rotation speed higher than the predetermined threshold or at a full speed for the predetermined period time, the controller 109 may therefore judge that the maintenance has already been completed, and heat generated during repair and during rotation of the fan at the rotation speed lower than the predetermined threshold has substantially discharged out of the housing 101, the controller 109 controls the fan 108 to adaptively rotate in a normal state within a predetermined rotation speed range. This normal state is that the controller 109, in response to detection that the plurality of partitions 105 are all located in the housing 101, controls the fan 108 to adaptively rotate within the predetermined rotation speed range, as shown in FIG. 3. Controlling the fan 108 to adaptively rotate within the predetermined rotation speed range means controlling the fan 108 to rotate by adaptively adjusting the rotation speed within the predetermined rotation speed range according to different heat generation of the disks 106 and other devices in different rotation conditions.

When the storage device 100 running in the normal state needs to be maintained or repaired, the user or the maintenance personnel needs to draw the tray 104 out of the housing 101. For example, in some embodiments, referring to FIG. 4, when the outermost partition 105 and disks 106 thereon are drawn out of the housing 101, the tray position detector 107 on the partition 105 can detect the act, for example by detection the changes of light thereon, and transmits the detection result to the controller 109. The controller 109, according to the detection result, judges that the tray 104 has already been drawn out of the housing 101, and the controller controls 108 to rotate at a rotation speed higher than the predetermined threshold or at a full speed to dissipate heat.

In some embodiments, the tray position detector 107 may always perform detection for the position of the tray 104. For example, in the case that the tray position detector 107 is a photoelectric detector, the tray position detector 107 may always detect the tray position without causing power loss. In some embodiments, the tray position detector 107 may detect the position of the tray 104 intermittently at a predetermined time interval.

Figure 4:
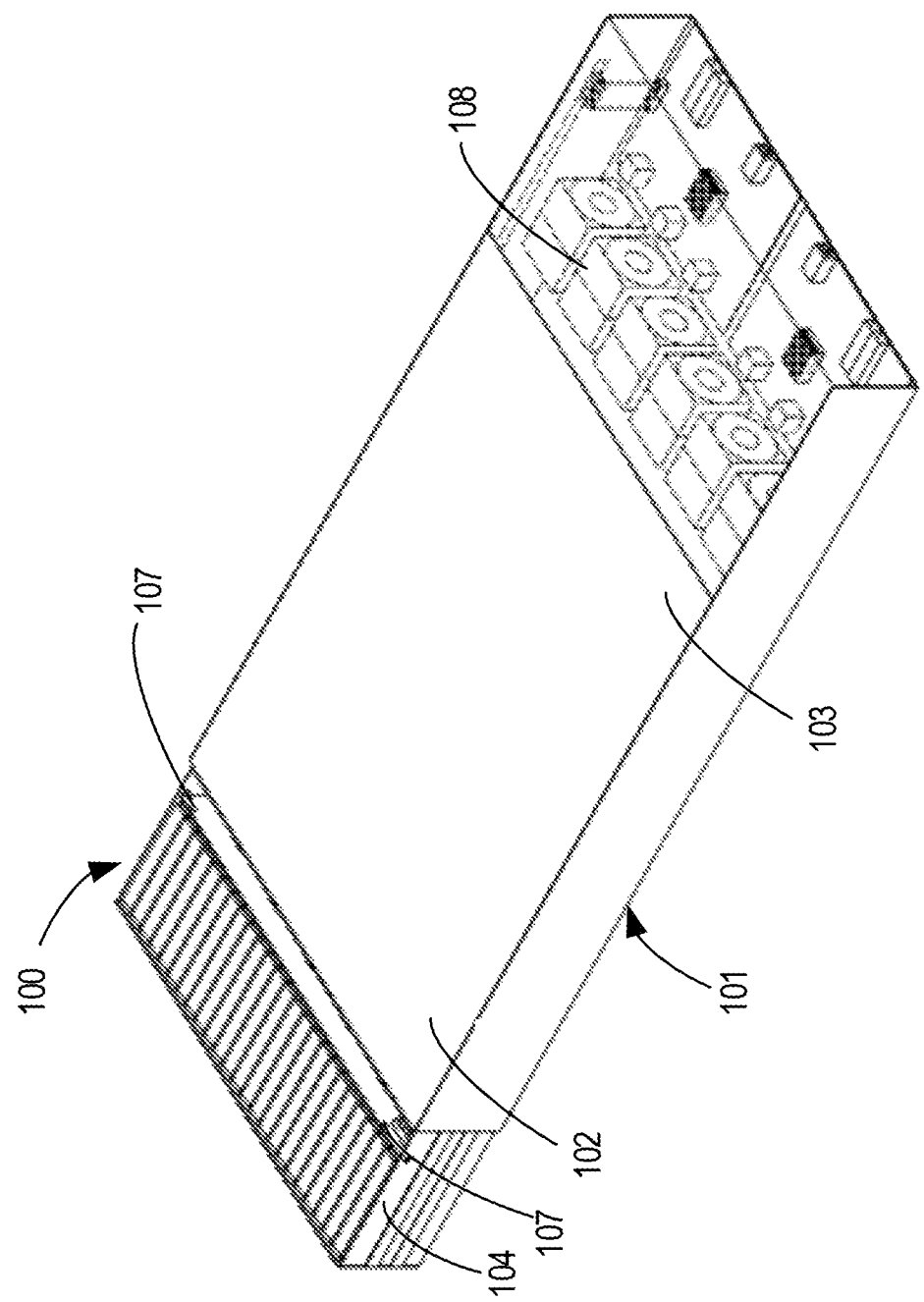
FIG. 4 illustrates a perspective view of a storage device according to embodiments of the present disclosure, wherein a row of disks in a tray are drawn out.

Maintenance may be completed by drawing out only one row of disks 106 in the tray 104, as shown in FIG. 4. In this case, since most of the tray 104 is located in the housing 101, the housing 101 will not get recessed due to the high-speed rotation of the fan 108. After completion of maintenance, analogous to the case in which the tray 104 is completely drawn out and then completely inserted into the housing 101, the controller 109 controls the fan 108 to continue to rotate at a rotation speed higher than the predetermined threshold or at a full speed for a predetermined period of time, and then resume to adaptively rotate within the predetermined rotation speed range.

Figure 5:
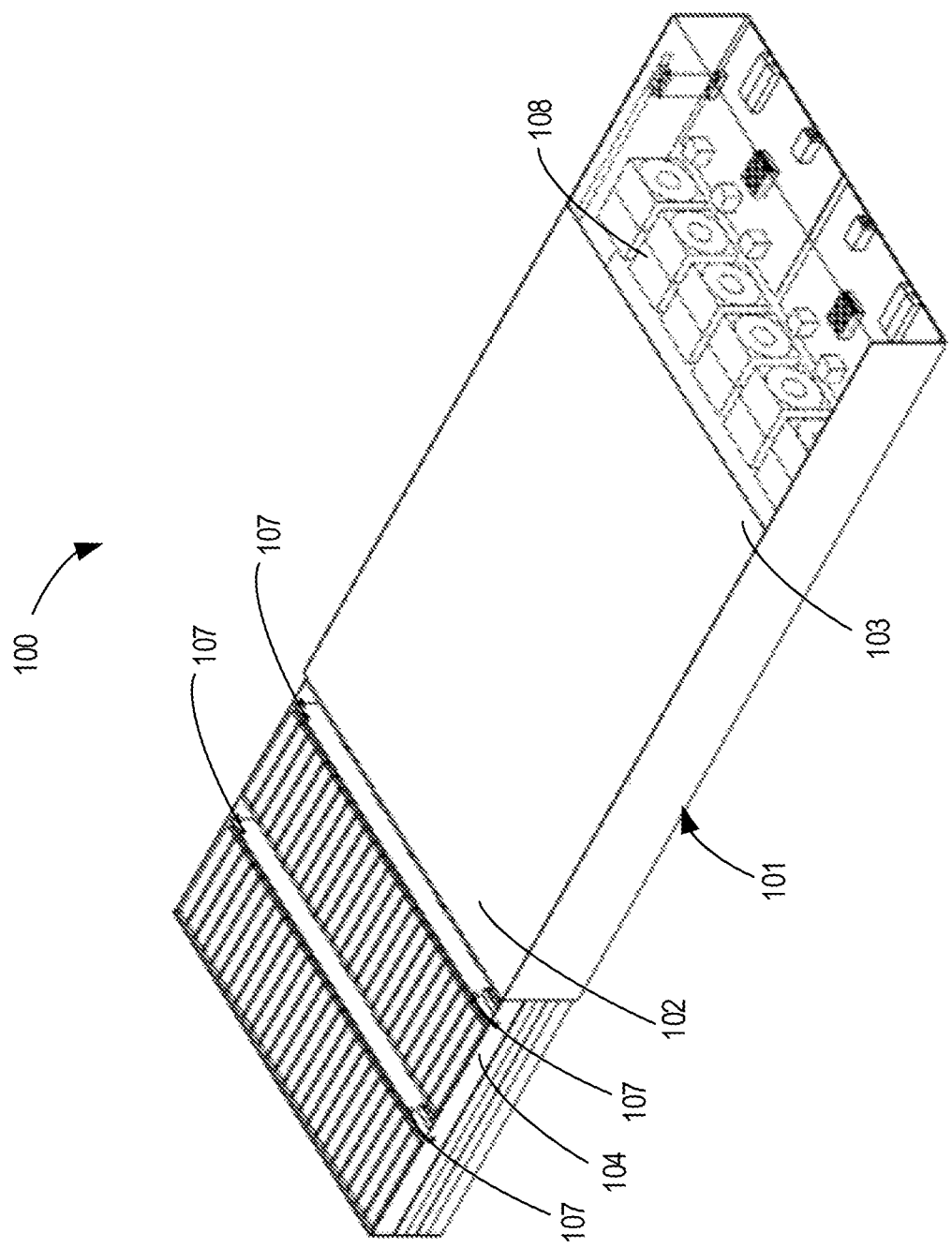
FIG. 5 illustrates a perspective view of a storage device according to embodiments of the present disclosure, wherein two rows of disks in a tray are drawn out.
Figure 6:
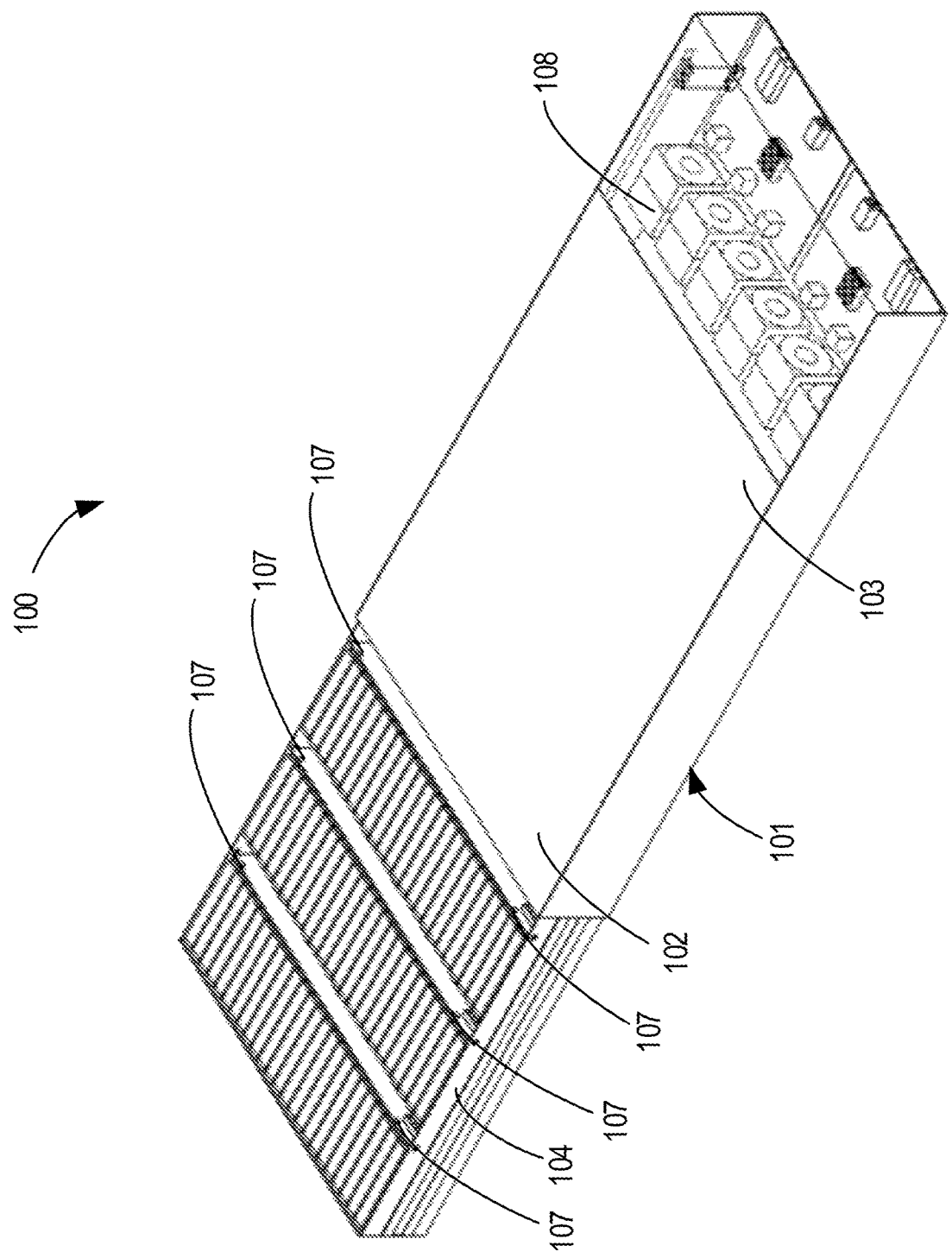
FIG. 6 illustrates a perspective view of a storage device according to embodiments of the present disclosure, wherein three rows of disks in a tray are drawn out.

Certainly, FIG. 4 may also be an intermediate phase in the process of drawing out the tray 104. That is to say, the tray 104 may also be further drawn out to maintain the corresponding disks or components as shown in FIGS. 5 and 6. In response to the positions of the tray 104 as shown in FIGS. 5 and 6, the control performed by the controller 109 may be similar to the control performed in the case that only one row of disks are drawn out as shown in FIG. 4, that is, the fan 108 is controlled to rotate at a rotation speed higher than the predetermined threshold or at a full speed. Certainly, it is to be understood that different control manners may also be employed as needed.

Figure 7:
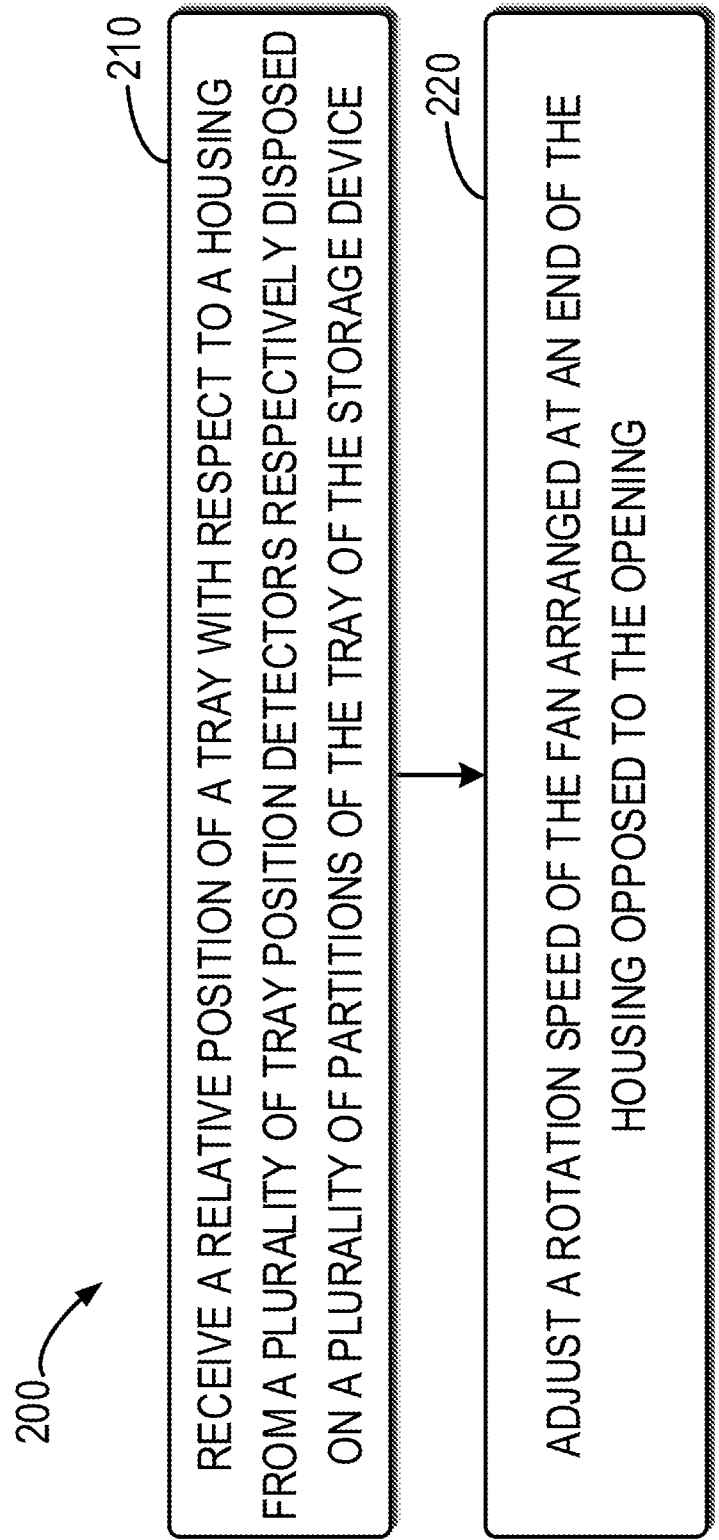
FIG. 7 illustrates a flow chart of a method of controlling a rotation speed of a fan in a storage device according to embodiments of the present disclosure.

FIG. 7 illustrates a flow chart of a method 200 of controlling a rotation speed of a fan 108 in a storage device 100 according to embodiments of the present disclosure. The method 200 may be executed by the controller 109 to control the rotation speed of the fan 108. As shown in FIG. 7, in block 210, the relative position of the tray 104 with respect to the housing 101 is received from a plurality of tray position detectors 107 respectively disposed on a plurality of partitions 105 of the tray 104 of the storage device 100. In block 220, the rotation speed of the fan 108 is adjusted according to the detected relative position.

In some embodiments, the method may further comprise, in response to detecting that one of the plurality of partitions 105 adjacent to the end 103 (namely, the partition located at the innermost side in the housing 101) enters the housing 101, controlling the fan 108 to rotate at a rotation speed lower than the predetermined threshold, so that the tray 104 can be smoothly inserted into the housing 101. In some embodiments, after the fan 108 rotates at a rotation speed lower than the predetermined threshold for a predetermined period of time, the fan 108 is controlled to rotate at a rotation speed higher than the predetermined threshold or at a full speed.

In some embodiments, the method may further comprise, in response to detecting that the plurality of partitions 105 are all located in the housing 101, controlling the fan 108 to rotate within a predetermined rotation speed range. In some embodiments, in response to at least one of the partitions 105 being drawn out of the housing 101, the fan 108 is controlled to rotate at a rotation speed higher than the predetermined threshold or at a full speed.

Another aspect of the present disclosure may further comprise a program product. The program product is adapted to be executed by a device such as a controller 109 to perform the above-mentioned method, to enable the controller 109 to control the rotation speed of the fan 108 according to the relative position of the tray 104 with respect to the housing 101.

Although some specific embodiments of the present disclosure have already been described in detail by way of examples, those skilled in the art should appreciate that the above examples are only intended to exemplarily but non-restrictively limit the scope of the present disclosure. Those skilled in the art appreciate that the above embodiments may be modified without departing from the scope and essence of the present disclosure. The scope of the present disclosure is limited by the appended claims.

In the description and claims hereunder, unless otherwise additionally needed in the context, the terms "comprise" and "comprise" are understood as comprising the illustrated components or component groups, without excluding any other components or component groups.

Citations of any prior art in the description are not, and should not be considered as admitting to imply that these prior art constitute the common knowledge.

It is to be understood that the claims below are illustrative claims, and are not intended to limit the scope of the claims to any future patent application based on the present application. It is possible to add components to or delete components from the exemplary claims in the future to further limit or re-limit the present disclosure.

What is claimed is:

1. A device, comprising:
    a housing comprising an opening at a first end;
    a fan arranged at a second end of the housing opposite the first end;
    a tray comprising a plurality of partitions, the tray being configured for at least partial removal of one or more of the plurality of partitions from the housing via the opening at the first end;
    a plurality of tray position detectors configured to detect a relative position of the plurality of partitions of the tray with respect to the housing; and
    a controller configured to adjust a rotation speed of the fan based at least in part on the detected relative position of the plurality of partitions of the tray.

2. The device of claim 1 wherein at least one of the plurality of partitions comprises one or more storage devices.

3. The device of claim 2 wherein the at least one partition comprises a first side and a second side opposite the first side, the one or more storage devices being coupled to the first side of the at least one partition and at least one of the plurality of tray position detectors being arranged on the second side of the at least one partition.

4. The device of claim 1 wherein at least one of the plurality of partitions comprises a first side and a second side, at least a first one of the plurality of tray position detectors being arranged on the first side of the at least one partition and at least a second one of the plurality of tray position detectors being arranged on the second side of the at least one partition.

5. The device of claim 1 wherein at least a given one of the tray position detectors is arranged on a given one of the plurality of partitions and comprises a photoelectric detector.

6. The device of claim 5 wherein the photoelectric detector is configured to determine a relative position of the given partition of the tray with respect to the housing based at least in part on detecting changes of light resulting from the given partition being at least one of inserted into and drawn out of the housing.

7. The device of claim 1 wherein at least one of the plurality of tray position detectors comprises a magnetic element.

8. The device of claim 1 wherein at least one of the plurality of tray position detectors comprises a gyro sensor.

9. The device of claim 1 wherein the controller is configured, in response to one or more of the plurality of tray position detectors detecting that a given one of the plurality of partitions of the tray enters the housing, to control the fan to rotate at a rotation speed lower than a predetermined threshold.

10. The device of claim 9 wherein the controller is configured, in response to determining that the fan has been rotating at the rotation speed lower than the predetermined threshold for a predetermined period of time, to increase the rotation speed of the fan.

11. The device of claim 9 wherein the predetermined threshold is based at least in part on a material of the housing and a thickness of the housing.

12. The device of claim 1 wherein the controller is configured, in response to one or more of the plurality of tray position detectors detecting that all of the plurality of partitions of the tray are located in the housing, to control the fan to rotate within a predetermined rotation speed range.

13. The device of claim 1 wherein the controller is configured, in response to one or more of the plurality of tray position detectors detecting that at least one of the plurality of partitions of the tray is drawn out of the housing, to control the fan to rotate at a rotation speed higher than a predetermined threshold.

14. The device of claim 1 wherein at least one of the plurality of tray position detectors is configured to detect a position of at least one of the plurality of partitions of the tray intermittently at a predetermined time interval.

15. A method comprising:
   detecting, utilizing one or more of a plurality of tray position detectors, a relative position of a plurality of partitions of a tray with respect to a housing of a device, the tray being configured for at least partial removal of one or more of the plurality of partitions from the housing via an opening at a first end of the housing;
   receiving, at a controller of the device, the detected relative position of the plurality of partitions of the tray with respect to the housing from said one or more of the plurality of tray position detectors;
   adjusting, utilizing the controller, a rotation speed of a fan arranged at a second end of the housing opposite the first end based at least in part on the detected relative position of the plurality of partitions of the tray with respect to the housing.

16. The method of claim 15 wherein at least one of the plurality of partitions comprises one or more storage devices, the at least one partition comprising a first side and a second side opposite the first side, the one or more storage devices being coupled to the first side of the at least one partition and at least one of the plurality of tray position detectors being arranged on the second side of the at least one partition.

17. The method of claim 15 wherein at least a given one of the plurality of tray position detectors is arranged on a given one of the plurality of partitions of the tray and comprises a photoelectric detector, the photoelectric detector being configured to determine a relative position of the given partition of the tray with respect to the housing based at least in part on detecting changes of light resulting from the given partition of the tray being at least one of inserted into and drawn out of the housing.

18. A program product adapted to be executed by a controller of a device to perform a method comprising:
   detecting, utilizing one or more of a plurality of tray position detectors, a relative position of a plurality of partitions of a tray with respect to a housing of the device, the tray being configured for at least partial removal of one or more of the plurality of partitions from the housing via an opening at a first end of the housing;
   receiving, at the controller, the detected relative position of the plurality of partitions of the tray with respect to the housing from said one or more of the plurality of tray position detectors;
   adjusting, utilizing the controller, a rotation speed of a fan arranged at a second end of the housing opposite the first end based at least in part on the detected relative position of the plurality of partitions of the tray with respect to the housing.

19. The program product of claim 18 wherein at least one of the plurality of partitions comprises one or more storage devices, the at least one partition comprising a first side and a second side opposite the first side, the one or more storage devices being coupled to the first side of the at least one partition and at least one of the plurality of tray position detectors being arranged on the second side of the at least one partition.

20. The program product of claim 18 wherein at least a given one of the plurality of tray position detectors is arranged on a given one of the plurality of partitions of the tray and comprises a photoelectric detector, the photoelectric detector being configured to determine a relative position of the given partition of the tray with respect to the housing based at least in part on detecting changes of light resulting from the given partition of the tray being at least one of inserted into and drawn out of the housing.

* * * * *